(12) United States Patent
Tomioka

(10) Patent No.: US 9,287,495 B2
(45) Date of Patent: Mar. 15, 2016

(54) METHOD OF MANUFACTURING SEMICONDUCTOR DEVICE

(71) Applicant: Kabushiki Kaisha Toshiba, Tokyo (JP)

(72) Inventor: Kazuhiro Tomioka, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 66 days.

(21) Appl. No.: 14/019,831

(22) Filed: Sep. 6, 2013

(65) Prior Publication Data

US 2014/0080227 A1    Mar. 20, 2014

(30) Foreign Application Priority Data

Sep. 20, 2012    (JP) ................... 2012-207471

(51) Int. Cl.
| | | |
|---|---|---|
| H01L 21/00 | (2006.01) | |
| H01L 43/12 | (2006.01) | |
| H01L 21/311 | (2006.01) | |
| H01L 21/768 | (2006.01) | |

(52) U.S. Cl.
CPC .......... *H01L 43/12* (2013.01); *H01L 21/31105* (2013.01); *H01L 21/31116* (2013.01); *H01L 21/76802* (2013.01)

(58) Field of Classification Search
None
See application file for complete search history.

(56) References Cited

U.S. PATENT DOCUMENTS

| | | | |
|---|---|---|---|
| 6,074,952 A * | 6/2000 | Liu et al. ................ | 438/706 |
| 2004/0256733 A1 | 12/2004 | Matsuno et al. | |
| 2005/0221573 A1 | 10/2005 | Kawahara et al. | |
| 2012/0068282 A1* | 3/2012 | Matsuoka et al. ........ | 257/421 |

FOREIGN PATENT DOCUMENTS

| | | |
|---|---|---|
| JP | 6-151363 | 5/1994 |
| JP | 6-163473 | 6/1994 |
| JP | 2002-190581 A | 7/2002 |
| JP | 2004-172312 | 6/2004 |
| JP | 2004-335721 A | 11/2004 |
| JP | 2005-286239 A | 10/2005 |

OTHER PUBLICATIONS

First Office Action of the Japanese Patent Office relating to Patent Application No. 2012-207471; dated Feb. 25, 2014 (English translation with Japanese version) (7 pages).

* cited by examiner

*Primary Examiner* — Sonya D McCall Shepard
(74) *Attorney, Agent, or Firm* — Finnegan, Henderson, Farabow, Garrett & Dunner, LLP

(57) ABSTRACT

According to one embodiment, a method of manufacturing a semiconductor device includes forming a silicon nitride layer on a metal layer, forming a plasma of a gas mixture of carbon oxide and oxygen, and selectively etching the silicon nitride layer with respect to the metal layer by using the plasma of the gas mixture.

19 Claims, 14 Drawing Sheets

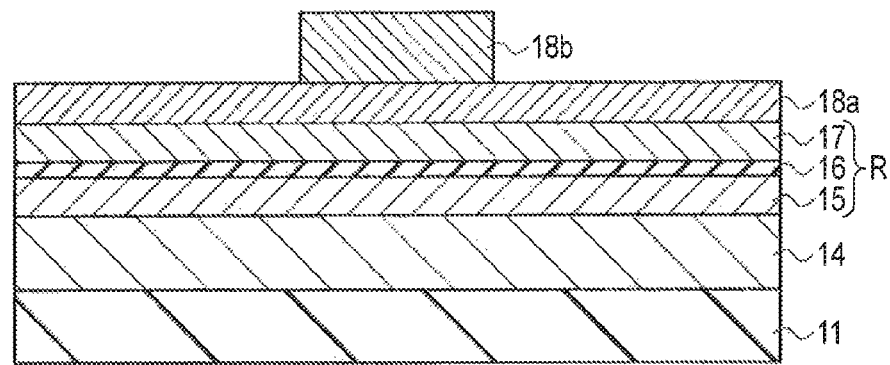
F I G. 12
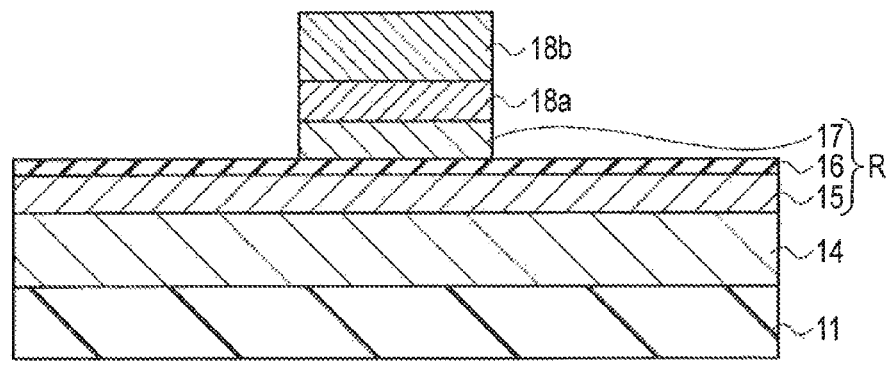
F I G. 13
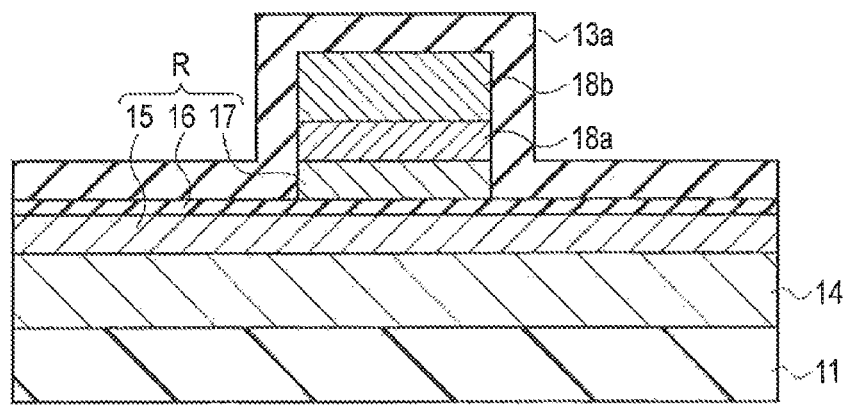
F I G. 14

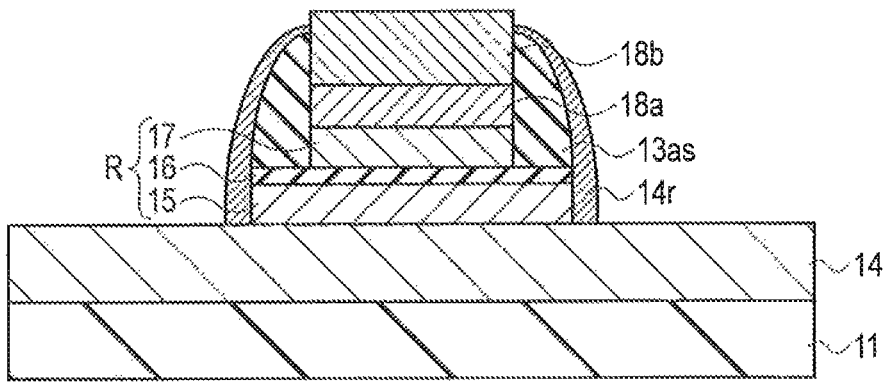
F I G. 15
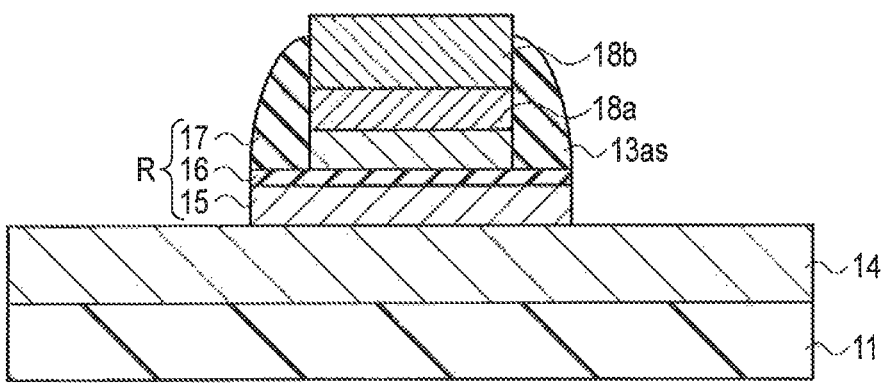
F I G. 16
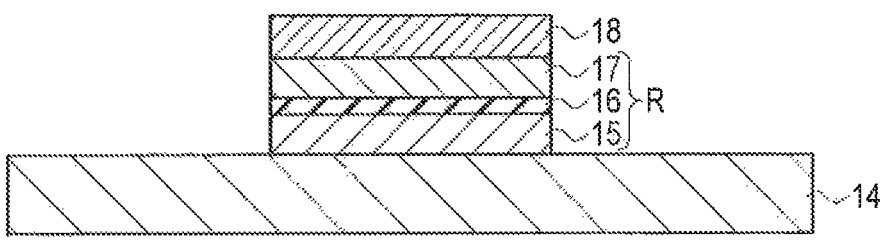
F I G. 17

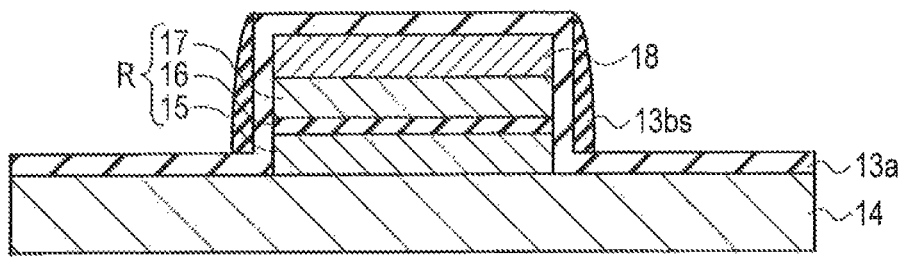
F I G. 22
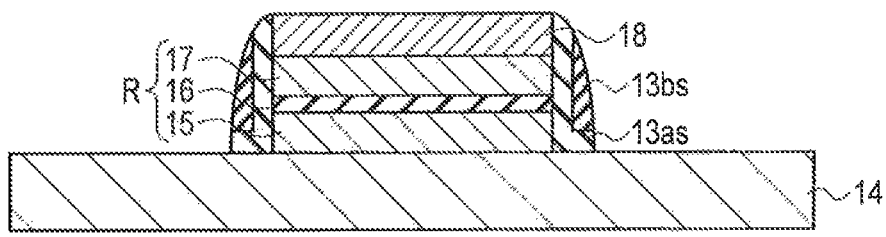
F I G. 23
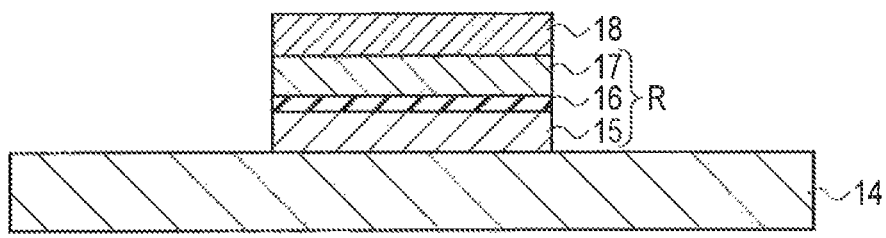
F I G. 24

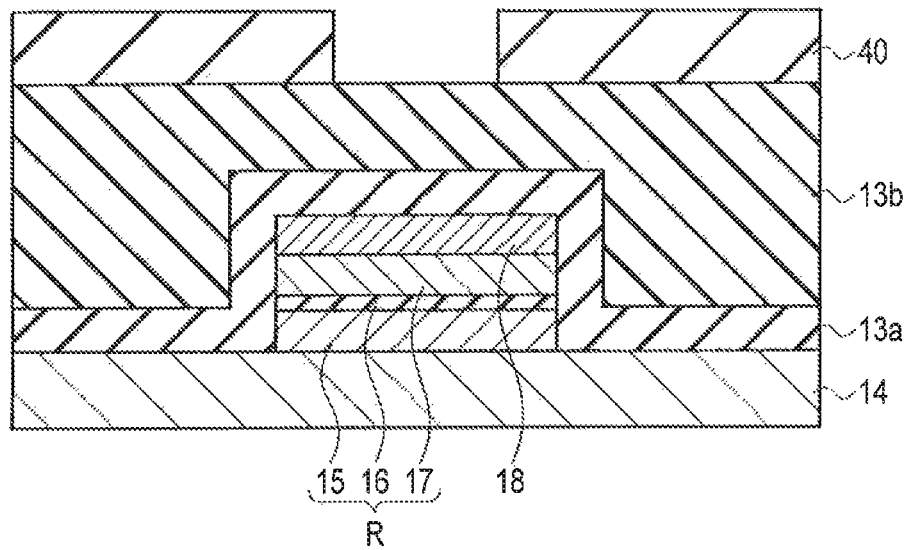
F I G. 25
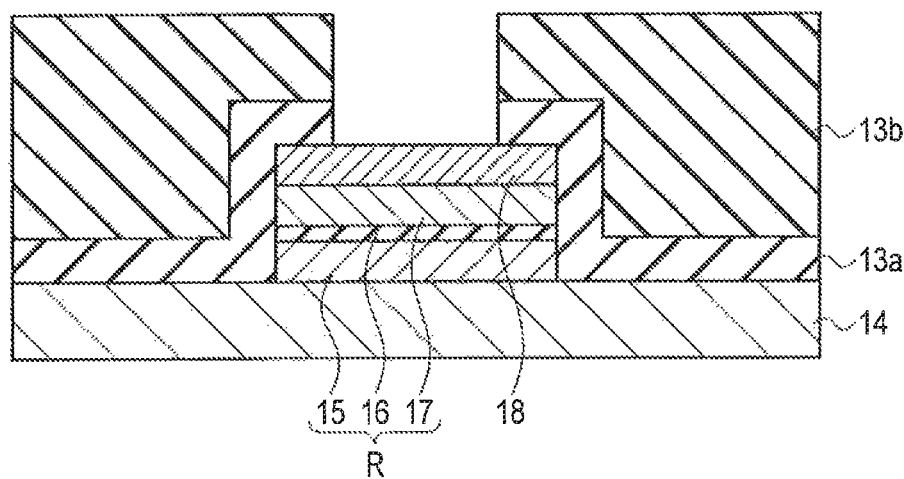
F I G. 26

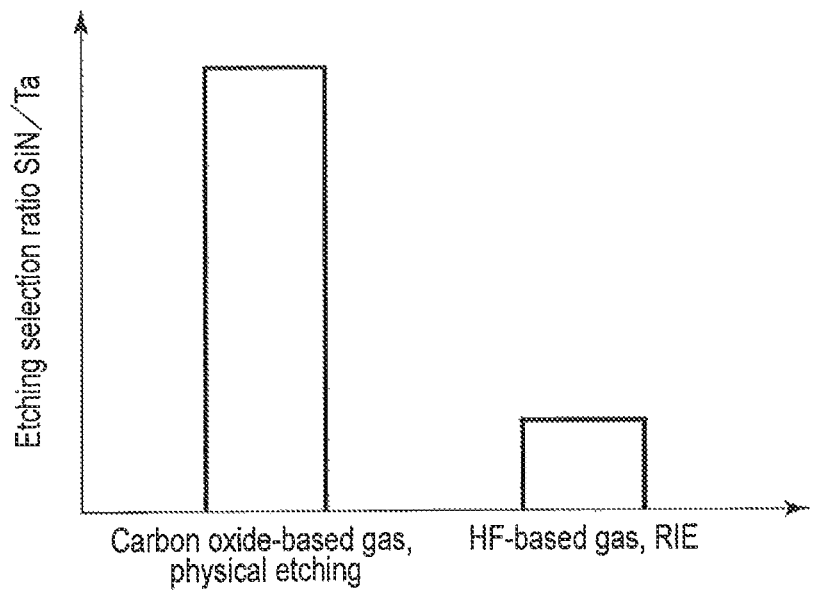
F I G. 27
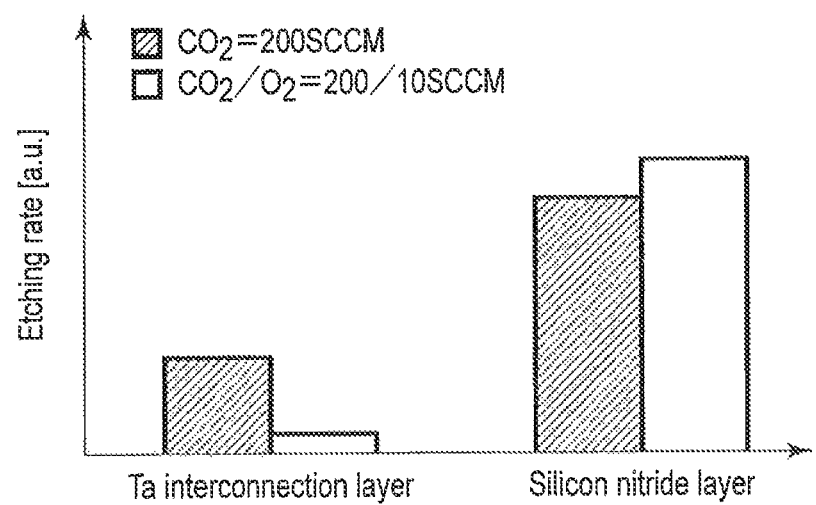
F I G. 28

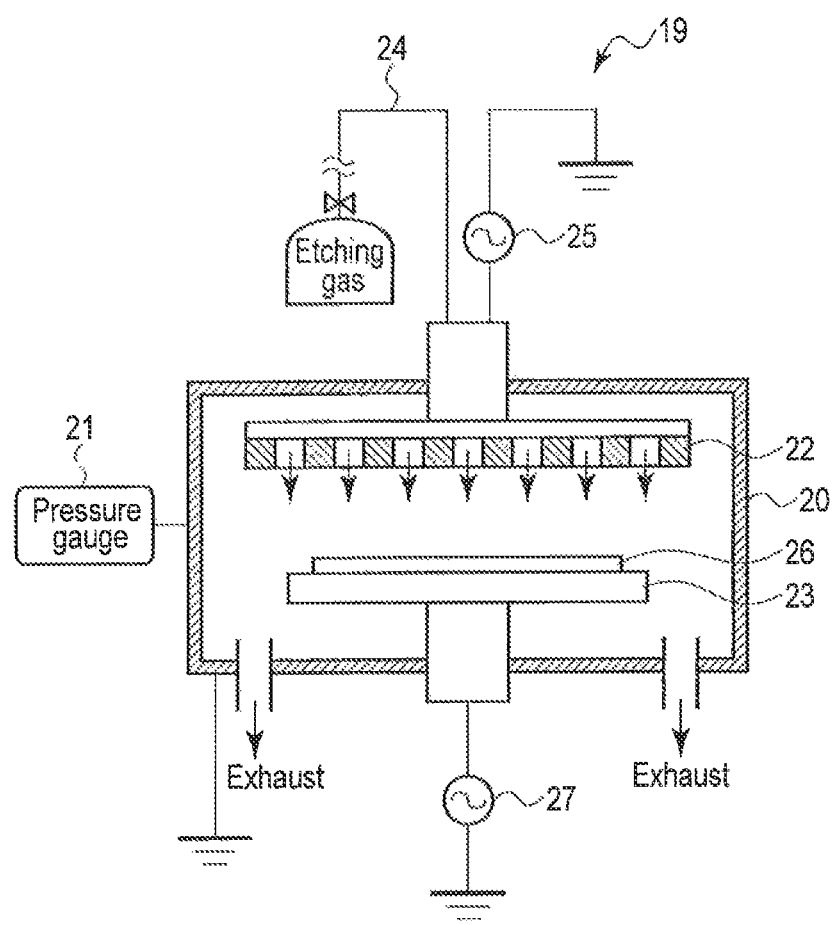
F I G. 30

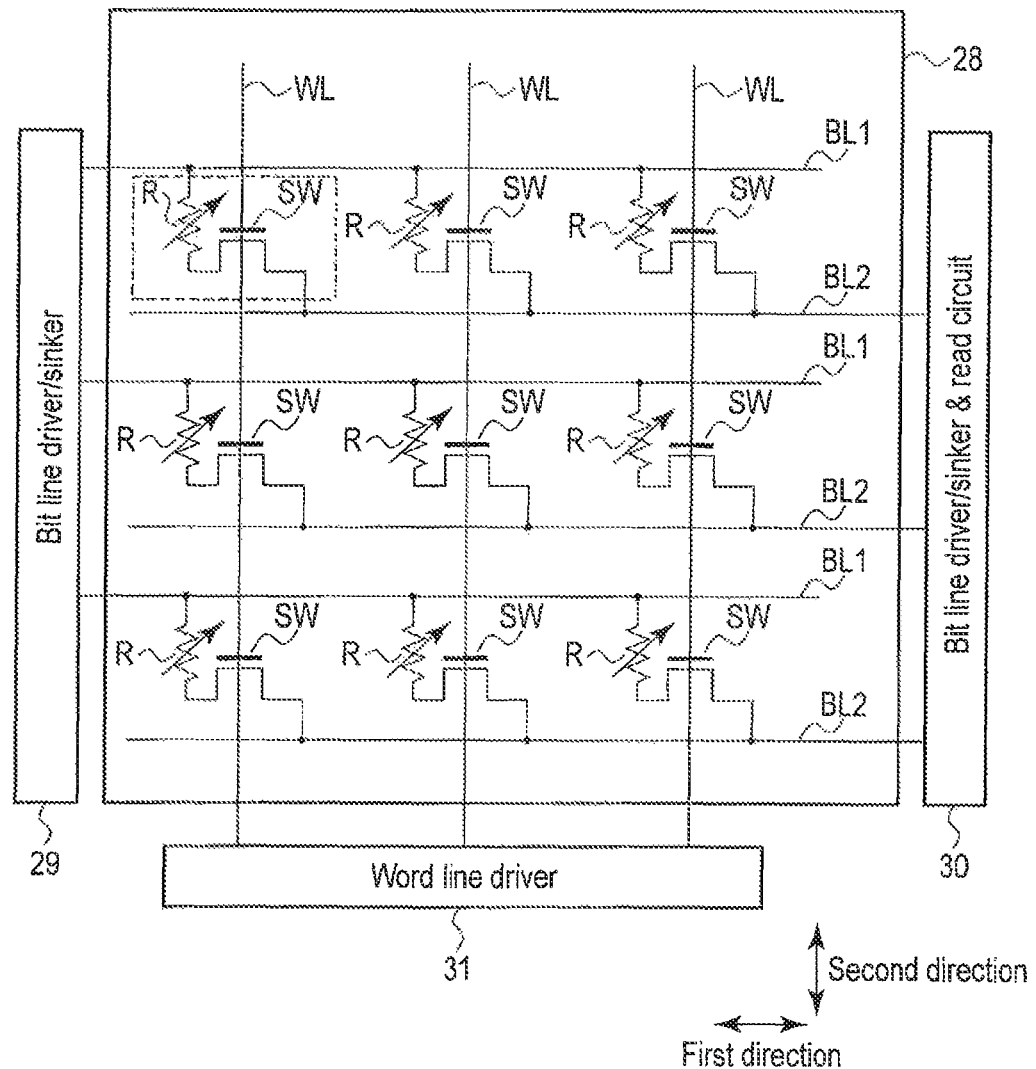
F I G. 31

METHOD OF MANUFACTURING SEMICONDUCTOR DEVICE

CROSS-REFERENCE TO RELATED APPLICATIONS

This application is based upon and claims the benefit of priority from Japanese Patent Application No. 2012-207471, filed Sep. 20, 2012, the entire contents of which are incorporated herein by reference.

FIELD

Embodiments described herein relate generally to a method of manufacturing a semiconductor device.

BACKGROUND

In a method of manufacturing a semiconductor device, if the underlying layer of an etching target layer is damaged when etching the etching target layer, the reliability of the semiconductor device may degrade. For example, when ensuring an electrical contact between interconnection layers, a contact hole needs to be formed in an insulating layer between the interconnection layers. This contact hole is formed using an anisotropic reactive etching method such as RIE (Reactive Ion beam Etching).

However, when a fluorine-based gas is used as the etching gas for the contact hole, unintended overetching occurs due to a low selection ratio of the insulating layer serving as the etching target layer with respect to the interconnection layer serving as the underlying layer, and an electrical contact failure occurs so that, for example, the contact hole extends through the interconnection layer.

To prevent the electrical contact failure between the interconnection layers, a technique of etching the insulating layer as the etching target layer at a high selection ratio with respect to the interconnection layer as the underlying layer is necessary.

BRIEF DESCRIPTION OF THE DRAWINGS

FIG. 12 is a sectional view showing the manufacturing method according to the third embodiment;
FIG. 13 is a sectional view showing the manufacturing method according to the third embodiment;
FIG. 14 is a sectional view showing the manufacturing method according to the third embodiment;
FIG. 15 is a sectional view showing the manufacturing method according to the third embodiment;
FIG. 16 is a sectional view showing the manufacturing method according to the third embodiment;
FIG. 17 is a sectional view showing a manufacturing method according to the fourth embodiment;
FIG. 22 is a sectional view showing the manufacturing method according to the modification of the fourth embodiment;
FIG. 23 is a sectional view showing the manufacturing method according to the modification of the fourth embodiment;
FIG. 24 is a sectional view showing a manufacturing method according to the fifth embodiment;
FIG. 25 is a sectional view showing the manufacturing method according to the fifth embodiment;
FIG. 26 is a sectional view showing the manufacturing method according to the fifth embodiment;
FIG. 27 is a graph showing the etching selection ratio of each etching type;.
FIG. 28 is a graph showing the etching rate of each etching gas for each material;
FIG. 30 is a view showing the structure of an etching apparatus;
FIG. 31 is a circuit diagram showing an example of the structure of a magnetic random access memory.

DETAILED DESCRIPTION

In general, according to one embodiment, disclosed is a method of manufacturing a semiconductor device, the method comprising: forming a silicon nitride layer on a metal layer; forming a plasma of a gas mixture of carbon oxide and oxygen; and selectively etching the silicon nitride layer with respect to the metal layer by using the plasma of the gas mixture.

The embodiments will now be described with reference to the accompanying drawings.

[Basic Concept]

In a method of manufacturing a semiconductor device, damage to an underlying layer when etching an etching target layer, for example, an electrical contact failure between interconnection layers leads to degradation in the reliability of the semiconductor device.

This is supposedly because when etching an insulating layer (for example, silicon oxide layer, silicon nitride layer, or the like) using a fluorine-based gas, a small etching selection ratio between the interconnection layer serving as the underlying layer and the insulating layer serving as the etching target layer makes it difficult to control the etching end point, and the interconnection layer serving as the underlying layer is damaged by unintended overetching.

For example, the etching target layer on the underlying layer does not always have a uniform film thickness. For this reason, even when etching ends in a predetermined etching time estimated from the etching rate and the film thickness (average value) of the etching target layer, it may be impossible to completely remove the etching target layer from above the underlying layer, and a residue may be generated. To prevent this, a process called overetching is performed by making the etching time of the etching target layer longer than the predetermined etching time, thereby completely removing the etching target layer from above the underlying layer.

However, if the selection ratio between the underlying layer and the etching target layer cannot be ensured sufficiently, the underlying layer is damaged by unintended overetching. Hence, appropriate etching can be performed by selecting, for example, an apparatus, a gas composition ratio, and a discharge condition to etch the underlying layer and the etching target layer at a high selection ratio.

[Reference Example]

Figure 1:
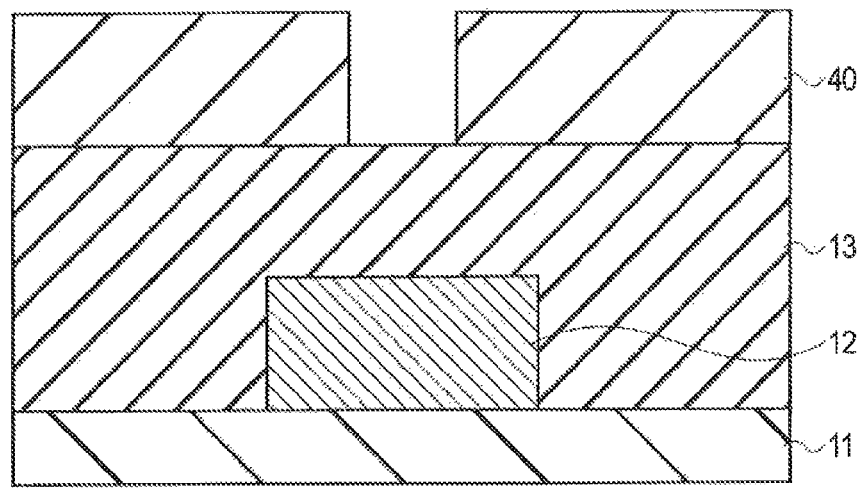
FIG. 1 is a sectional view showing a manufacturing method according to a reference example.
Figure 2:
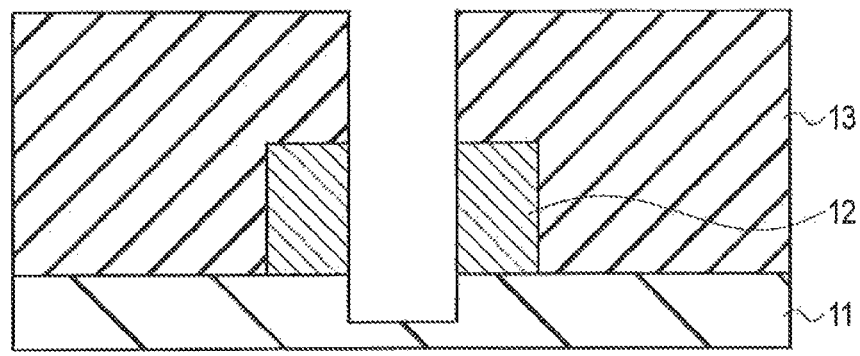
FIG. 2 is a sectional view showing the manufacturing method according to the reference example.

FIGS. 1 and 2 show a general contact hole forming method in a semiconductor device manufacturing method.

First, insulating layer 11 is formed on a substrate. Interconnection layer 12 is deposited on insulating layer 11 and patterned. Insulating layer 13 is formed on interconnection layer 12. Resist pattern 40 is formed on interconnection layer 12. A contact hole is formed in insulating layer 13 using resist pattern 40 as a mask. After that, resist pattern 40 is removed.

In the above-described method, the contact hole is formed by etching insulating layer 13 by, for example, RIE using a fluorine-based gas, for example, a fluorocarbon or a hydrofluorocarbon such as tetrafluorocarbon ($CF_4$) or trifluoromethane ($CHF_3$) as an etching gas until interconnection layer 12 is exposed.

However, when the fluorine-based gas is used as the etching gas for insulating layer 13, unintended overetching occurs, and the contact hole sometimes extends through insulating layer 13 and interconnection layer 12 and reaches insulating layer 11, as shown in FIG. 2.

Since the selection ratio of insulating layer 13 with respect to interconnection layer 12 is low, overetching progresses more than the intended overetching depth. Hence, interconnection layer 12 that is the underlying layer of insulating layer 13 is also etched, and the contact hole consequently extends through interconnection layer 12 and reaches insulating layer 11.

As described above, if interconnection layer 12 is damaged by unintended overetching, an operation error or a short circuit occurs in the semiconductor device. Hence, it is demanded to find appropriate etching conditions and ensure a sufficient selection ratio between interconnection layer 12 and insulating layer 13 to prevent the degradation in the reliability of the semiconductor device.

In the following embodiments, considering that the reliability of a semiconductor device degrades due to damage to an interconnection layer serving as an underlying layer caused by overetching, a technique of eliminating the damage (overetching) to (of) the underlying layer by etching the etching target layer at a higher selectivity with respect to the underlying layer will be proposed.

More specifically, when a metal layer containing at least one of Ta, Ti, W, Mo, Nb, Al, Ni, Cu, Ir, Pt, and Au is used as the underlying layer, and a silicon nitride layer on the metal layer is to be etched, physical etching that is performed by forming a plasma of a gas mixture containing carbon oxide and oxygen is used. That is, in this etching mechanism, when the metal layer serving as the underlying layer is exposed by physical etching of the silicon nitride layer serving as the etching target layer, the metal layer serving as the underlying layer and the etching gas cause a chemical reaction. As a result, a nonvolatile oxide and carbon that are reaction products are deposited on the underlying layer, and the reaction between the underlying layer and the etching gas converges. In other words, the nonvolatile reaction products generated by the reaction between the underlying layer and the etching gas are deposited on the underlying layer and serve as a protective film to impede etching of the underlying layer and reduce the etching rate. This can prevent damage to the underlying layer.

As described above, when the underlying layer and the etching target layer are etched at a high selectivity under appropriate etching conditions, the efficiency percentage never decrease due to an operation error or a short circuit in the semiconductor device caused by damage to the interconnection layer serving as the underlying layer. For this reason, for example, when improving the yield of semiconductor devices, it is possible to easily manufacture semiconductor devices at a high reproducibility and high efficiency percentage separately from the problem of the electrical contact failure between the interconnection layers.

Several embodiments that embody the above-described basic concept will be explained below.

[Embodiments]

First Embodiment

Figure 3:
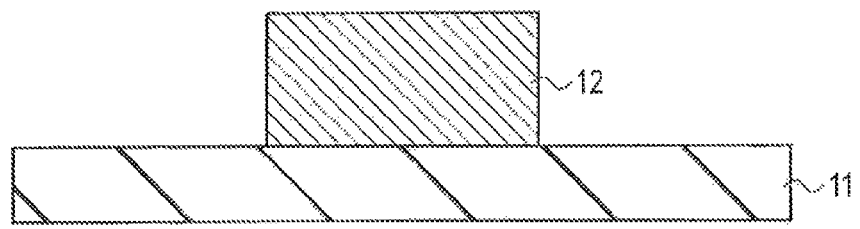
FIG. 3 is a sectional view showing a manufacturing method according to the first embodiment.
Figure 4:
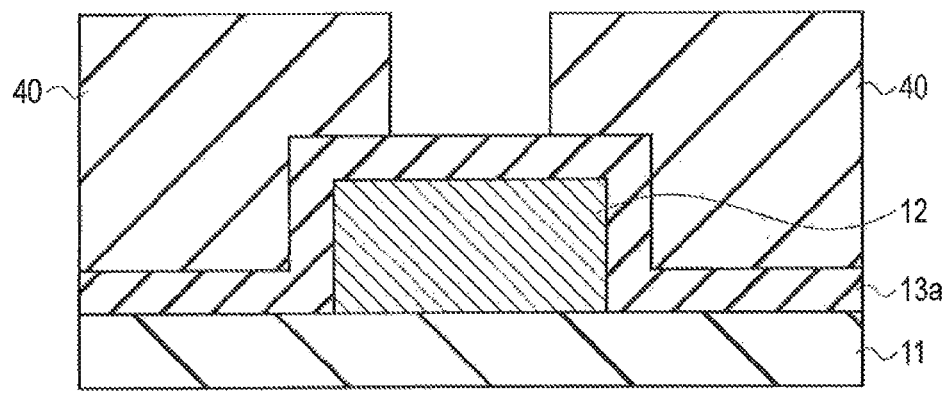
FIG. 4 is a sectional view showing the manufacturing method according to the first embodiment.
Figure 5:
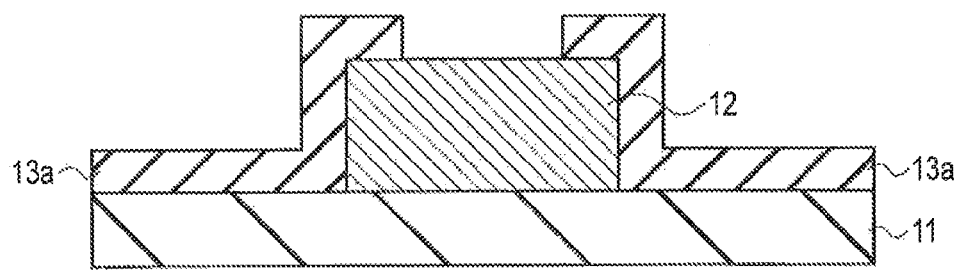
FIG. 5 is a sectional view showing the manufacturing method according to the first embodiment.

FIGS. 3, 4, and 5 show the first embodiment.

FIGS. 3, 4, and 5 illustrate steps in the manufacture of a semiconductor device.

The same reference numerals as in FIGS. 1 and 2 denote the same elements in FIGS. 3, 4, and 5. Interconnection layer 12 is a Ta interconnection layer. Silicon nitride layer 13a corresponds to insulating layer 13 shown in FIGS. 1 and 2.

The characteristic feature of this embodiment is as follows.

When anisotropic physical etching is performed using a gas mixture of carbon dioxide and oxygen, a contact hole can be formed in silicon nitride layer 13a without damaging Ta interconnection layer 12 by overetching.

First, insulating layer 11 is formed on a substrate, as shown in FIG. 3. Ta interconnection layer 12 is deposited on insulating layer 11 and patterned. Silicon nitride layer 13a is formed on Ta interconnection layer 12, as shown in FIG. 4. Resist pattern 40 is formed on silicon nitride layer 13a. A contact hole is formed in silicon nitride layer 13a using resist pattern 40 as a mask. After that, resist pattern 40 is removed, thereby obtaining the structure shown in FIG. 5.

In the above-described method, the contact hole is formed by etching silicon nitride layer 13a by anisotropic physical etching using a gas mixture of carbon dioxide and oxygen as an etching gas until Ta interconnection layer 12 is exposed.

In this embodiment, since the gas mixture of carbon dioxide and oxygen is used as the etching gas, the silicon nitride layer 13a can be etched at a high selectivity with respect to Ta interconnection layer 12. For this reason, the contact hole can be formed on Ta interconnection layer 12 without overetching.

Silicon nitride layer 13a does not react with the plasma of the etching gas mixture of carbon dioxide and oxygen and is etched by the anisotropic physical etching. On the other hand, Ta interconnection layer 12 reacts with the plasma of the etching gas mixture of carbon dioxide and oxygen and generates nonvolatile tantalum oxide. In addition, carbon deposits on Ta interconnection layer 12. As a result, these nonvolatile products can protect Ta interconnection layer 12 and prevent it from being etched. That is, even when Ta interconnection layer 12 is exposed to the etching gas, silicon nitride layer 13a on Ta interconnection layer 12 can completely be removed without overetching.

The nonvolatile tantalum oxide and carbon generated by the reaction between Ta interconnection layer 12 and the etching gas deposit on the sidewall and the bottom surface of the contact hole. The film is thin and has a low resistance. Hence, the film need not always be removed. On the other hand, if the constituent element of silicon nitride layer 13a driven out by the physical etching is redeposited on the sidewall of the contact hole, the opening area of the contact hole becomes narrow to raise the resistance of the contact plug. Hence, silicon nitride layer 13a is preferably made as thin as possible.

To increase in-plasma occupation of active species components which promote the etching process of the silicon nitride layer 13a, and to increase a probability that such active species components reach the bottom surface of the contact hole, reducing the pressure at the time of etching is effective. When the pressure at the time of etching conditions is reduced, the energy per ion increases and the anisotropy of physical etching increases, and an unintentional overetching may occur due to the etching of Ta interconnection layer 12. In such a case, the power may be reduced to decrease the ion energy for improving a selection ratio with respect to the Ta interconnection layer 12 at the time of forming the contact hole in silicon nitride layer 13a.

The etching end timing is derived from, for example, a method of, after end point detection of detecting a change in the density of radicals, ions, or the like associated with etching from the emission spectrum of the plasma has been performed, or after a time derived from the film thickness of the etching target material has been reached, continuing etching for a preset time to reliably eliminate the residue and then ending the processing.

An example of plasma conditions when etching a silicon nitride layer will be described below. The etching gas for the silicon nitride layer is a gas mixture of carbon dioxide and oxygen.

| | |
|---|---|
| carbon dioxide flow rate | 200 sccm |
| oxygen flow rate | 10 sccm |
| pressure | 1.5 Pa |
| first frequency | 60 MHz |
| first power | 300 W |
| second frequency | 13.56 MHz |
| second power | 500 W |
| etching time | 3 min |

The first electrode is the electrode on a side where the etching gas is introduced. The frequency applied to the first electrode is the first frequency, and the power applied to the first electrode is the first power.

The second electrode is the electrode on a side where the substrate is set. The frequency applied to the second electrode is the second frequency, and the power applied to the second electrode is the second power.

As described above, according to the first embodiment, silicon nitride layer 13a can be etched at a high selectivity with respect to Ta interconnection layer 12. It is therefore possible to form the contact hole on Ta interconnection layer 12 without overetching. Since the interconnection layers can reliably be connected to each other at a low resistance, an electrical contact failure between the interconnection layers can be prevented.

Second Embodiment

FIGS. 6, 7, 8, 9, and 10 show the second embodiment.

FIGS. 6, 7, 8, 9, and 10 illustrate steps in the manufacture of a semiconductor device.

Note that the same reference numerals as in FIGS. 3, 4, and 5 denote the same elements in FIGS. 6, 7, 8, 9, and 10, and a detailed description thereof will be omitted.

In this embodiment, the etching target layer on Ta interconnection layer 12 has a stacked structure including silicon oxide layer 13b deposited on silicon nitride layer 13a, unlike the first embodiment. As a characteristic feature, silicon oxide layer 13b is etched by RIE using a fluorine-based etching gas until silicon nitride layer 13a is exposed. After that, silicon nitride layer 13a is etched by nonreactive anisotropic physical etching using a gas mixture of carbon dioxide and oxygen until Ta interconnection layer 12 is exposed, thereby forming a contact hole on Ta interconnection layer 12 without overetching.

Figure 6:
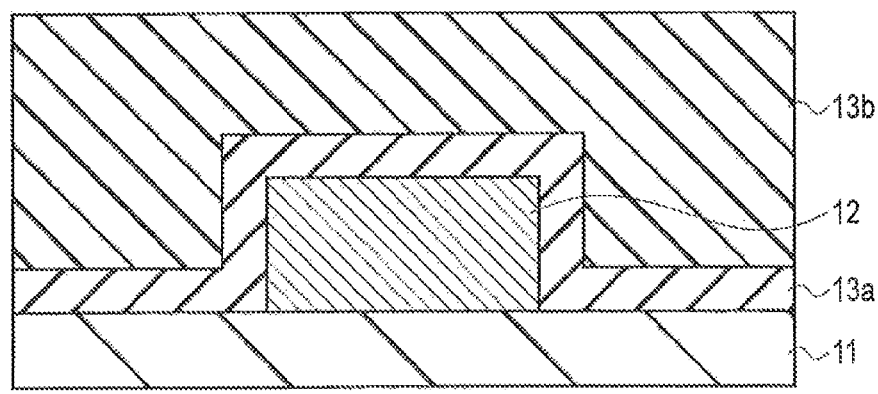
FIG. 6 is a sectional view showing a manufacturing method according to the second embodiment.
Figure 7:
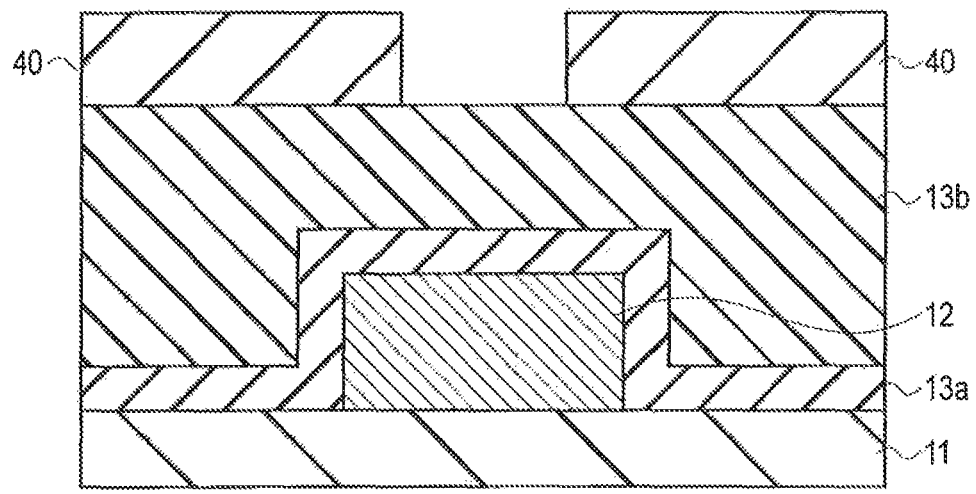
FIG. 7 is a sectional view showing the manufacturing method according to the second embodiment.
Figure 8:
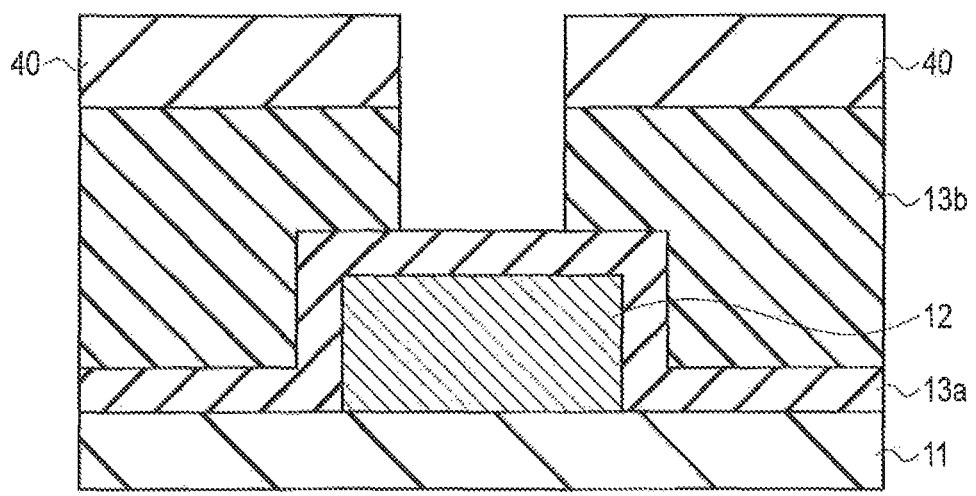
FIG. 8 is a sectional view showing the manufacturing method according to the second embodiment.
Figure 9:
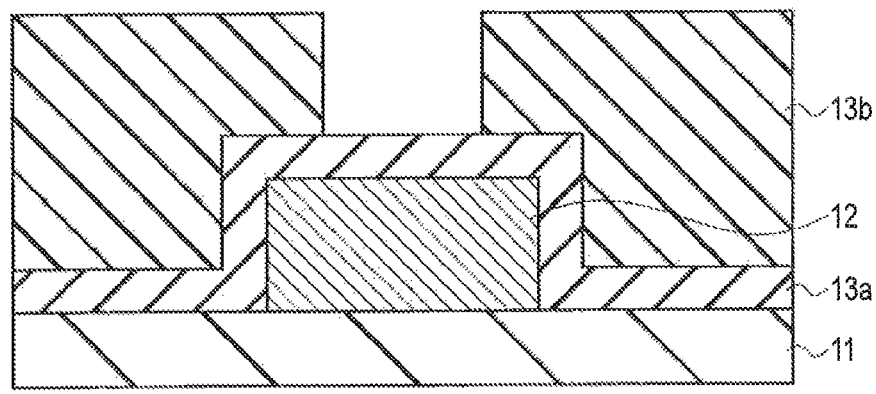
FIG. 9 is a sectional view showing the manufacturing method according to the second embodiment.
Figure 10:
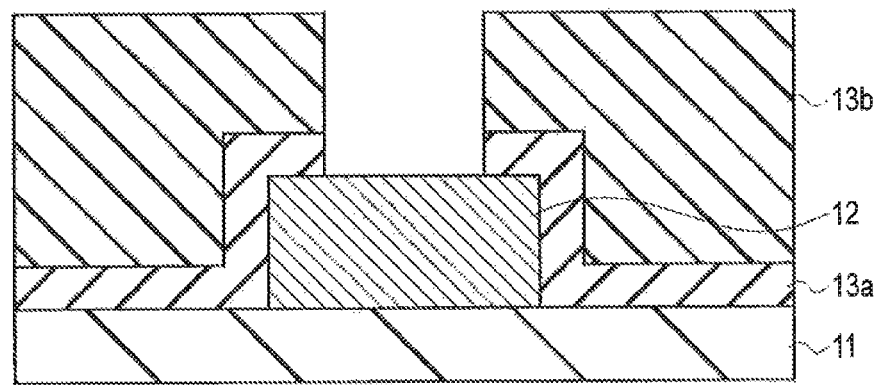
FIG. 10 is a sectional view showing the manufacturing method according to the second embodiment.

First, insulating layer 11 is formed on a substrate, as shown in FIG. 6. Ta interconnection layer 12 is deposited on insulating layer 11 and patterned. Silicon nitride layer 13a is formed on Ta interconnection layer 12. Silicon oxide layer 13b is formed on silicon nitride layer 13a. Resist pattern 40 is formed on silicon oxide layer 13b, as shown in FIG. 7. A first contact hole is formed in silicon oxide layer 13b using resist pattern 40 as a mask, as shown in FIG. 8. Resist pattern 40 is removed by ashing, as shown in FIG. 9. After that, a second contact hole is formed in silicon nitride layer 13a, thereby obtaining the structure shown in FIG. 10.

In the above-described method, the first contact hole is formed by etching silicon oxide layer 13b by RIE using a fluorine-based etching gas until silicon nitride layer 13a is exposed. The second contact hole is formed by etching silicon nitride layer 13a by anisotropic physical etching using a gas mixture of carbon dioxide and oxygen as an etching gas until Ta interconnection layer 12 is exposed. Using silicon nitride layer 13a as an etching stopper makes it possible to prevent overetching of Ta interconnection layer 12 by RIE using the fluorine-based etching gas.

However, etching of silicon nitride layer 13a can also continuously be performed after etching of silicon oxide layer 13b without intervening ashing by switching the etching conditions such as the gas species of the etching gas, the power, and the pressure.

The mechanism for forming a contact hole on Ta interconnection layer 12 without overetching by etching insulating layer 13a at a high selection ratio with respect to Ta interconnection layer 12 is the same as in the first embodiment, and a description thereof will be omitted.

An example of plasma conditions when etching silicon oxide layer 13b and silicon nitride layer 13a will be described below. The etching gas for silicon oxide layer 13b is a gas mixture of $C_4F_8$, Ar, and $O_2$, and the etching gas for silicon nitride layer 13a is a gas mixture of carbon dioxide and oxygen.

Plasma Conditions of Silicon Oxide Layer Etching

| | |
|---|---|
| $C_4F_8$ flow rate | 15 sccm |
| Ar flow rate | 300 sccm |
| $O_2$ flow rate | 10 sccm |
| pressure | 5 Pa |
| first frequency | 60 MHz |
| first power | 1000 W |
| second frequency | 13.56 MHz |
| second power | 1500 W |
| etching time | time corresponding to film thickness of silicon oxide |

The above-described etching conditions of the silicon oxide layer are representative conditions, and any other conditions capable of plasma-etching silicon oxide are usable. However, as etching conditions for the silicon oxide layer, what is desired is not high selection ratio with respect to the interconnection layer but is high etching rate to improve throughput. Thus, both the pressure and the power can be set high in the etching conditions for the silicon oxide layer. In other words, in the etching of the silicon nitride layer in which the selective ratio with respect to the interconnection layer is more important than the throughput, both the pressure and the power in the etching of the silicon nitride layer are generally set lower than the pressure and the power in the etching of the silicon oxide layer.

Plasma Conditions of Silicon Nitride Layer Etching

| | |
|---|---|
| carbon dioxide flow rate | 200 sccm |
| oxygen flow rate | 10 sccm |
| pressure | 1.5 Pa |
| first frequency | 60 MHz |
| first power | 300 W |
| second frequency | 13.56 MHz |
| second power | 500 W |
| etching time | 3 min |

The first electrode is the electrode on a side where the etching gas is introduced. The frequency applied to the first electrode is the first frequency, and the power applied to the first electrode is the first power.

The second electrode is the electrode on a side where the substrate is set. The frequency applied to the second electrode is the second frequency, and the power applied to the second electrode is the second power.

As described above, according to the second embodiment, silicon nitride layer 13a can be etched at a high selectivity with respect to Ta interconnection layer 12. It is therefore possible to form a contact hole on Ta interconnection layer 12 without overetching. Since the interconnection layers can reliably be connected to each other at a low resistance, an electrical contact failure between the interconnection layers can be prevented.

When the above-described method is used, etching stops due to generation of a metal oxide. Hence, a high selectivity of the silicon nitride layer with respect to the interconnection layer can be achieved. Depositing the metal oxide film and carbon on the surface of the interconnection layer makes it possible to prevent overetching of the interconnection layer and manufacture a device having excellent electrical characteristics.

Third Embodiment

FIGS. 11, 12, 13, 14, 15, and 16 show the third embodiment.

Note that the same reference numerals as in FIGS. 3, 4, 5, 6, 7, 8, 9, and 10 denote the same elements in FIGS. 11, 12, 13, 14, 15, and 16, and a description thereof will be omitted.

As a characteristic feature of this embodiment, the method is applied to manufacture an MRAM (Magnetoresistive Random Access Memory) that is a high-speed large-capacity nonvolatile memory.

An MTJ (Magnetic Tunnel Junction) element that performs the memory operation of the MRAM has a structure in which an insulating layer (tunnel barrier layer) as a nonmagnetic layer is sandwiched between two magnetic layers. Data is recorded by changing the direction of magnetization (spin) of one of the magnetic layers by a current.

The MTJ element is formed by stacking a magnetic layer and a tunnel barrier layer on a substrate and then etching portions between bits to separate the structure into predetermined storage units (bits).

A method of manufacturing an MTJ element made of CoFeB/MgO/CoFeB using a CoFeB magnetic layer and an MgO barrier layer will be described below.

Figure 11:
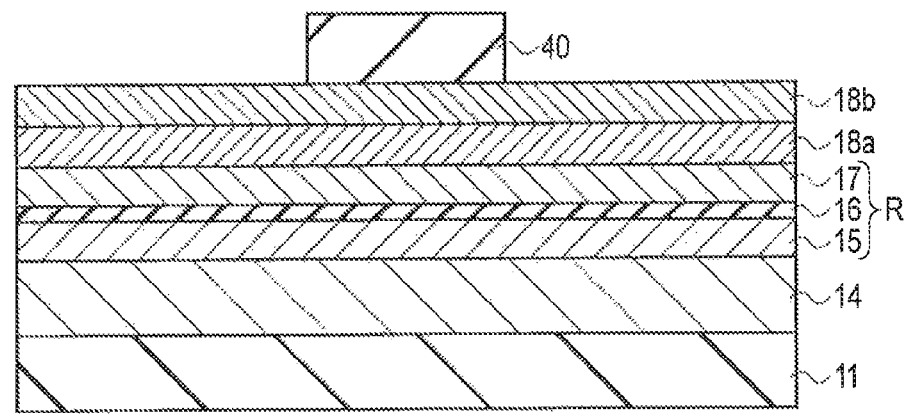
FIG. 11 is a sectional view showing a manufacturing method according to the third embodiment.

First, as shown in FIG. 11, lower electrode 14 made of Ta, storage layer 15, nonmagnetic layer 16, reference layer 17, upper electrode 18a, and metal hard mask layer 18b are continuously deposited by sputtering on insulating layer 11 formed on a silicon wafer. Resist pattern 40 is formed on metal hard mask layer 18b by photolithography. Metal hard mask layer 18b is patterned along resist pattern 40 by RIE using plasma etching. After patterning of metal hard mask layer 18b, resist pattern 40 is removed by a wet or dry process, as shown in FIG. 12.

Upper electrode 18a and reference layer 17 are processed up to the surface of nonmagnetic layer 16 along metal hard mask layer 18b by IBE (Ion Beam Etching) or RIE, thereby obtaining a structure shown in FIG. 13. As shown in FIG. 14, silicon nitride layer ($Si_3N_4$) 13a is formed on the surface of the MTJ element by plasma-enhanced CVD (PeCVD).

Subsequently, when silicon nitride layer 13a, nonmagnetic layer 16, and storage layer 15 are etched back, sidewall insulating film 13 as is formed, and simultaneously, magnetoresistive element R is formed, as shown in FIG. 15. However, when this etchback is performed by IBE, Ta that has come flying upon sputtering of lower electrode 14 at the time of exposure of lower electrode 14 covers the sidewall of sidewall insulating film 13 as, that is, resputtering occurs. Since Ta 14r deposited on the sidewall of sidewall insulating film 13 as is conductive, storage layer 15 and metal hard mask layer 18b may short-circuit and cause an operation error.

When the etchback is performed by anisotropic physical etching using a gas mixture of carbon dioxide and oxygen as an etching gas, as shown in FIG. 16, the etching amount of lower electrode (Ta) 14 decreases at the time of exposure of lower electrode 14. It is therefore possible to prevent a short circuit between storage layer 15 and metal hard mask layer 18b by resputtering.

As described above, according to the third embodiment, etching (etchback) of storage layer 15 using sidewall insulating film 13 as formed from a silicon nitride layer as a mask is performed by anisotropic physical sputtering using the gas mixture of carbon dioxide and oxygen as an etching gas. This makes it possible to suppress sputtering of lower electrode (Ta) 14 and prevent an operation error caused by resputtering of Ta.

The effect of suppressing damage (sputtering) of lower electrode 14 at the time of etchback can also be obtained using not Ta but a metal such as Ti, W, Mo, Nb, Al, Ni, Cu, Ir, Pt, or Au as lower electrode 14.

Fourth Embodiment

Figure 18:
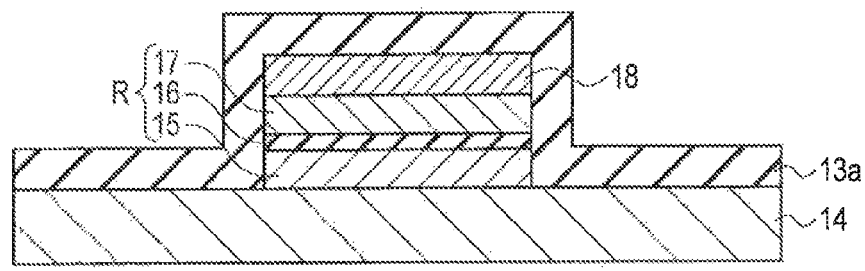
FIG. 18 is a sectional view showing the manufacturing method according to the fourth embodiment.
Figure 19:
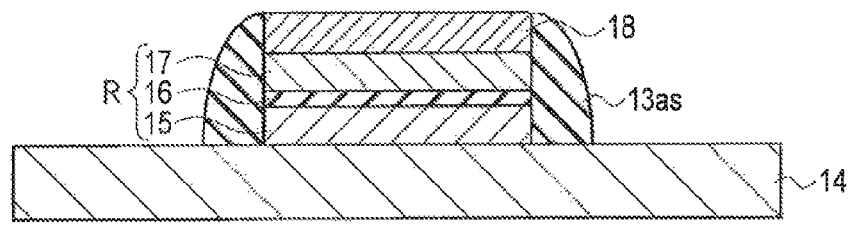
FIG. 19 is a sectional view showing the manufacturing method according to the fourth embodiment.

FIGS. 17, 18, and 19 show the fourth embodiment.

Note that the same reference numerals as in FIGS. 3, 4, 5, 6, 7, 8, 9, 10, 11, 12, 13, 14, 15, and 16 denote the same elements in FIGS. 17, 18, and 19, and a description thereof will be omitted.

The characteristic feature of this embodiment is as follows.

Silicon nitride layer 13a that covers magnetoresistive element R known as a semiconductor device is processed by nonreactive anisotropic physical etching using a gas mixture of carbon oxide and oxygen as an etching gas, thereby protecting the sidewall of magnetoresistive element R from oxidation and damage and also preventing damage to lower electrode 14.

First, as shown in FIG. 17, storage layer 15 having a perpendicular, variable magnetization is formed on lower electrode 14. Next, nonmagnetic layer 16 is formed on storage layer 15. Reference layer 17 having a perpendicular, invariable magnetization is formed on nonmagnetic layer 16. Upper electrode 18 is formed on reference layer 17. After that, as shown in FIGS. 18 and 19, sidewall protective film 13 as is formed on the sidewalls of storage layer 15, nonmagnetic layer 16, reference layer 17, and upper electrode 18.

Each of lower electrode 14 and upper electrode 18 is a metal layer containing at least one of Ta, Ti, W, Mo, Nb, Al, Ni, Cu, Ir, Pt, and Au, which reacts with the gas mixture of carbon dioxide and oxygen and generates a nonvolatile metal oxide and carbon.

The process of forming sidewall protective film 13 as will be explained below.

First, as shown in FIG. 18, silicon nitride layer 13a is deposited using a deposition apparatus such as CVD so as to cover the upper surface of lower electrode 14, the sidewalls of storage layer 15, nonmagnetic layer 16, reference layer 17, and upper electrode 18, and the upper surface of upper electrode 18. When silicon nitride layer 13a is etched in a direction perpendicular to the film surface by nonreactive anisotropic physical etching using a gas mixture of carbon dioxide and oxygen as an etching gas, sidewall protective film 13 as is formed in a self-aligned manner, as shown in FIG. 19.

In this embodiment, anisotropic etching is performed so that side etching of the sidewall of insulating layer 13a hardly occurs, and etching progresses only in the direction perpendicular to the film surface of silicon nitride layer 13a. For this reason, sidewall protective film 13 as is formed in a self-aligned manner at the time of etching.

An etching mechanism of this embodiment will be described below.

When nonreactive anisotropic physical etching for silicon nitride layer 13a progresses, and lower electrode 14 and upper electrode 18 are exposed, the exposed portions of lower electrode 14 and upper electrode 18 react with carbon dioxide and oxygen in the etching gas to generate a nonvolatile metal oxide and carbon. The nonvolatile metal oxide and carbon deposit on the surfaces of lower electrode 14 and upper electrode 18 to form a protective film and impede etching. Hence, the etching rate abruptly lowers, and the etching converges. As a result, sidewall protective film 13 as can be formed in a self-aligned manner without damaging lower electrode 14 and upper electrode 18.

As described above, according to the fourth embodiment, when anisotropic physical etching is performed using the gas mixture of carbon dioxide and oxygen as the etching gas, the selection ratio between lower electrode 14, upper electrode 18, and silicon nitride layer 13a can sufficiently be ensured. Hence, sidewall protective film 13 as can be formed in a self-aligned manner without overetching.

As a modification of the fourth embodiment, the sidewall protective film may have a stacked structure of silicon nitride layer 13a and silicon oxide layer 13b.

An etching mechanism used when the sidewall protective film has the stacked structure will be described below with reference to FIGS. 20, 21, 22, and 23.

Figure 20:
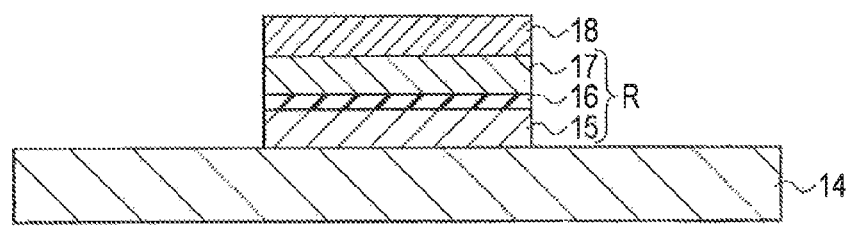
FIG. 20 is a sectional view showing a manufacturing method according to a modification of the fourth embodiment.
Figure 21:
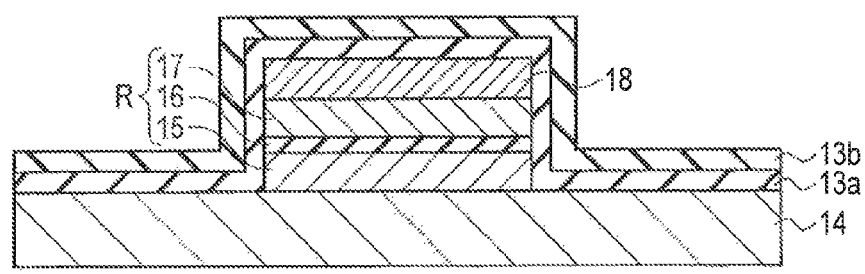
FIG. 21 is a sectional view showing the manufacturing method according to the modification of the fourth embodiment.

First, as shown in FIGS. 20 and 21, silicon oxide layer 13b is formed on silicon nitride layer 13a using a deposition apparatus such as CVD. When silicon oxide layer 13b is etched by RIE using a fluorine-based gas until silicon nitride layer 13a is exposed, sidewall insulating film 13bs is formed, as shown in FIG. 22. Note that silicon nitride layer 13a functions as an etching stopper in RIE using the fluorine-based gas.

As shown in FIG. 23, silicon nitride layer 13a is etched by anisotropic physical etching using a gas mixture of carbon dioxide and oxygen until lower electrode 14 and upper electrode 18 are exposed. When lower electrode 14 and upper electrode 18 react with the etching gas, a nonvolatile metal oxide film and carbon are generated as reaction products and deposit on lower electrode 14 and upper electrode 18. For this reason, the etching rate abruptly lowers.

As a result, silicon oxide layer 13b and silicon nitride layer 13a are completely removed from above lower electrode 14 and upper electrode 18, and sidewall protective films 13as and 13bs are formed on the sidewall of the MTJ element and the sidewall of upper electrode 18 in a self-aligned manner.

As described above, according to the modification of the fourth embodiment, when etching silicon oxide layer 13b using a fluorine-based etching gas, silicon nitride layer 13a is provided on lower electrode 14 and upper electrode 18 as an etching stopper, thereby preventing damage to lower electrode 14 and upper electrode 18. Additionally, when etching silicon nitride layer 13a using a gas mixture of carbon dioxide and oxygen, the nonvolatile metal oxide and carbon deposit on lower electrode 14 and upper electrode 18 so that silicon nitride layer 13a can be removed from above lower electrode 14 and upper electrode 18 without overetching. It is therefore possible to form sidewall protective films 13bs and 13as having the stacked structure of silicon oxide layer 13b and silicon nitride layer 13a without damaging lower electrode 14 and upper electrode 18.

Fifth Embodiment

FIGS. 24, 25, and 26 show the fifth embodiment.

Note that the same reference numerals as in FIGS. 3, 4, 5, 6, 7, 8, 9, 10, 11, 12, 13, 14, 15, 16, 17, 18, 19, 20, 21, 22, and 23 denote the same elements in FIGS. 24, 25, and 26, and a description thereof will be omitted.

The characteristic feature of this embodiment is as follows.

In a structure in which magnetoresistive element R is covered with silicon nitride layer 13a and silicon oxide layer 13b, silicon oxide layer 13b is etched by RIE using a fluorine-based gas, and silicon nitride layer 13a is etched by nonreactive anisotropic physical etching using a gas mixture of carbon dioxide and oxygen, thereby forming a contact hole on the upper electrode without overetching.

First, as shown in FIG. 24, storage layer 15 having a perpendicular, variable magnetization is formed on lower electrode 14. Next, nonmagnetic layer 16 is formed on storage layer 15. Reference layer 17 having a perpendicular, invariable magnetization is formed on nonmagnetic layer 16. Upper electrode 18 is formed on reference layer 17. Next, as shown in FIG. 25, silicon nitride layer 13a is formed on the upper surface of lower electrode 14, the sidewalls of storage layer 15, nonmagnetic layer 16, reference layer 17, and upper electrode 18, and the upper surface of upper electrode 18. Silicon oxide layer 13b is formed on silicon nitride layer 13a. Resist pattern 40 is formed on silicon oxide layer 13b. A first contact hole is formed in silicon oxide layer 13b using resist pattern 40 as a mask. Resist pattern 40 is removed by ashing. After that, a second contact hole is formed in silicon nitride layer 13a using patterned silicon oxide layer 13b as a mask, as shown in FIG. 26.

The first contact hole is obtained by etching silicon oxide layer 13b by fluorine-based RIE using resist pattern 40 as a mask until silicon nitride layer 13a is exposed. Silicon nitride layer 13a functions as an etching stopper and prevents upper electrode 18 from being corroded by the fluorine-based etching.

The second contact hole is obtained by etching silicon nitride layer 13a by nonreactive anisotropic physical etching using a gas mixture of carbon dioxide and oxygen as an etching gas and patterned silicon oxide layer 13b as a mask until upper electrode 18 is exposed. When upper electrode 18 is exposed from silicon nitride layer 13a, it reacts with the etching gas to generate a nonvolatile metal oxide and carbon. The nonvolatile metal oxide and carbon deposit on upper electrode 18 to form a protective film and impede etching so that the etching rate abruptly lowers.

Each of lower electrode 14 and upper electrode 18 is a metal layer containing at least one of Ta, Ti, W, Mo, Nb, Al, Ni, Cu, Ir, Pt, and Au, which reacts with the gas mixture of carbon dioxide and oxygen and generates a nonvolatile metal oxide and carbon.

As described above, according to the fifth embodiment, when etching silicon oxide layer 13b using a fluorine-based etching gas, silicon nitride layer 13a is provided on silicon oxide layer 13b as an etching stopper, thereby forming the first contact hole without damaging upper electrode 18. On the other hand, when etching silicon nitride layer 13a using a gas mixture of carbon dioxide and oxygen, a nonvolatile reaction product deposits on upper electrode 18. This protects upper electrode 18 from etching and simultaneously abruptly lowers the etching rate to implement etching at a high selectivity. It is therefore possible to form the second contact hole on upper electrode 18 without overetching.

Others

In the first to fifth embodiments, a gas mixture of carbon dioxide and oxygen is used as the etching gas. However, a gas mixture of carbon monoxide and oxygen may be used as the etching gas.

Experimental Examples

FIG. 27 shows an experimental result obtained by comparing the etching selection ratio of physical etching using a carbon oxide-based gas with that of RIE using an HF-based gas.

The abscissa represents the etching type, and the ordinate represents the selection ratio (SiN/Ta) of a silicon nitride layer with respect to a Ta interconnection layer.

As shown in FIG. 27, the silicon nitride layer can be etched at a higher selection ratio with respect to the Ta interconnection layer in physical etching using a carbon oxide-based gas as an etching gas than in RIE using a fluorine-based gas as an etching gas.

Figure 29A:
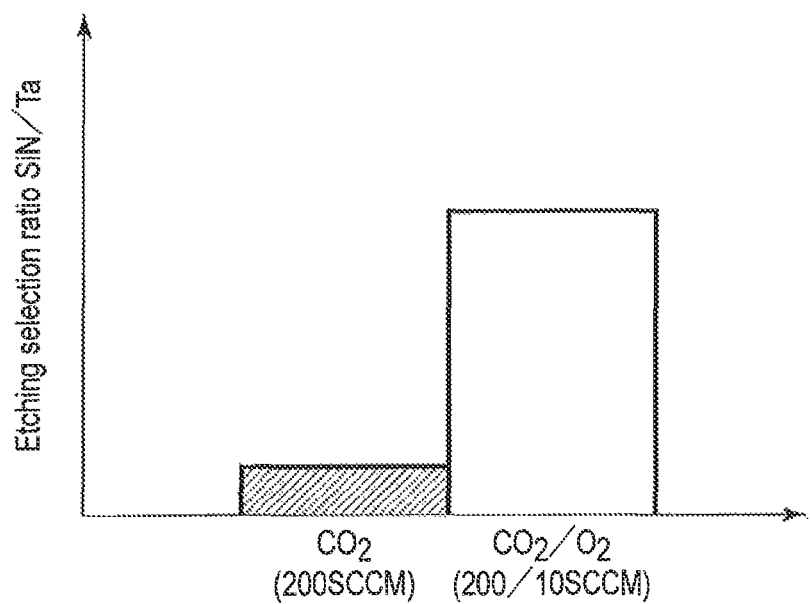
FIG. 29A is a graph showing the etching selection ratio of each etching gas type.

FIG. 28 shows an experimental result obtained by comparing the etching rates of the respective etching gases for each material. FIG. 29A shows an experimental result obtained by comparing the etching selection ratios for the respective etching gas types. FIG. 29A shows the difference in the etching selection ratio (SiN/Ta) between an etching condition using only carbon dioxide and an etching condition when the oxygen flow rate with respect to carbon dioxide is set to 5%.

As shown in FIGS. 28 and 29A, when oxygen is added to the carbon dioxide-based etching gas, a nonvolatile reaction product is readily formed. This impedes etching of the Ta interconnection layer and lowers the etching rate. Hence, the etching amount of Ta decreases, and resputtering of Ta can be suppressed. It is therefore possible to prevent an operation error caused by resputtering of Ta.

As described above, when oxygen is added to the carbon dioxide-based gas, the etching rate and selection ratio of the silicon nitride layer with respect to Ta greatly improve.

As the conditions to improve the etching selection ratio of the silicon nitride layer with respect to the Ta interconnection layer, preferably, the carbon dioxide flow rate is 50 sccm (inclusive) to 500 sccm (inclusive), the oxygen flow rate is 1% (inclusive) to 10% (inclusive) of the carbon dioxide flow rate, the pressure in the reaction chamber of etching is 0.5 Pa (inclusive) to 10 Pa (inclusive), the power of the first high-frequency power supply is 50 W (inclusive) to 1000 W (inclusive), and the power of the second high-frequency power supply is 30 W to 1000 W.

Figure 29B:
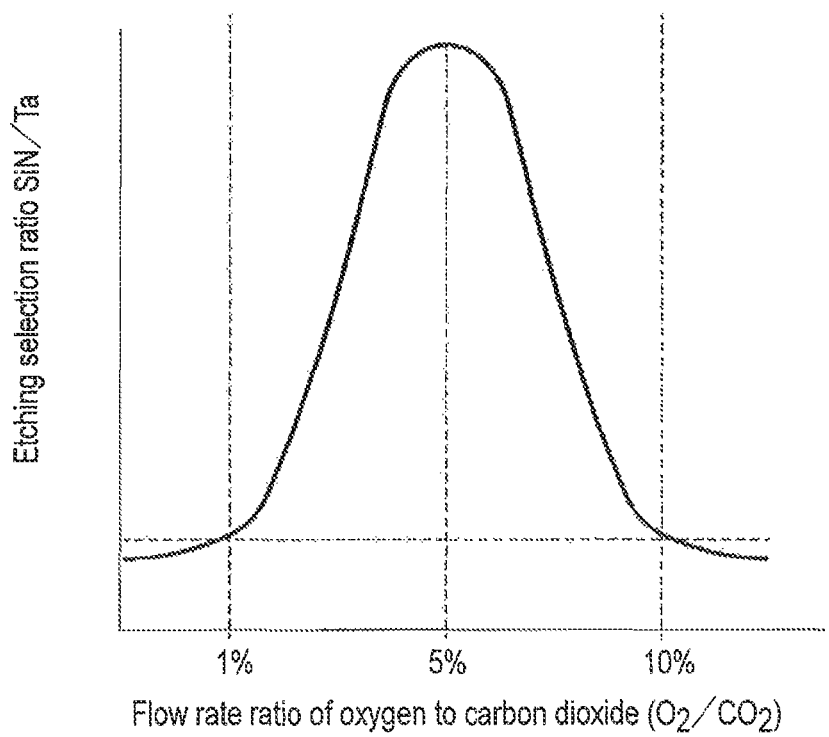
FIG. 29B is a graph showing a change in the etching selection ratio when the flow rate of an etching gas is changed.

For example, FIG. 29B shows a change in the etching selection ratio when the pressure and power conditions are set to predetermined values, and the flow rate of the etching gas is changed.

According to FIG. 29B, when the flow rate ratio ($O_2/CO_2$) of oxygen to carbon dioxide is 1% (inclusive) to 10% (inclusive), the etching selection ratio of silicon nitride with respect to the Ta interconnection layer becomes higher than that when carbon dioxide is solely used. In addition, the etching selection ratio of silicon nitride with respect to the Ta interconnection layer is maximized when the flow rate ratio ($O_2/CO_2$) of oxygen to carbon dioxide is about 5%.

The same effect as described above can also be obtained by using a gas mixture of carbon monoxide and oxygen as an etching gas. However, since the gas mixture of carbon dioxide and oxygen can provide a better effect, the gas mixture of carbon dioxide and oxygen is preferably used as the etching gas in the above-described embodiments.

In this embodiment, the underlying layer is a Ta interconnection layer, and the etching target layer is a silicon nitride layer. When the underlying layer is a metal layer containing at least one of Ta, Ti, W, Mo, Nb, Al, Ni, Cu, Ir, Pt, and Au, the selection ratio between the underlying layer and the etching target layer can greatly be improved by using the gas mixture of carbon dioxide and oxygen as an etching gas.

As described above, when an etching gas that reacts with the underlying layer to form a protective film is used, the etching target layer can be etched at a high selectivity with respect to the underlying layer. It is therefore possible to remove the etching target layer from above the underlying layer without overetching.

Description of Apparatus

FIG. 30 illustrates an example of a dry etching apparatus used in the embodiment.

Dry etching apparatus 19 has a bipolar parallel electrode structure including reaction chamber 20, pressure gauge 21 provided on a side surface of reaction chamber 20, first electrode 22 provided in the upper portion of reaction chamber 20, and second electrode 23 provided in the lower portion of reaction chamber 20 at a position facing parallel to first electrode 22.

First electrode 22 has a shower plate shape with gas inlets opening in one electrode. Gas supply line 24 and first high-frequency power supply 25 are independently connected to first electrode 22. First high-frequency power supply 25 supplies a first frequency and first power.

Second electrode 23 is a susceptor electrode that holds substrate 26. Second high-frequency power supply 27 is independently connected to second electrode 23. Second high-frequency power supply 27 supplies a second frequency and second power.

The etching gas is supplied from gas supply line 24 to reaction chamber 20 through the gas inlets of first electrode 22 at a predetermined flow rate. The etching gas supplied into reaction chamber 20 is held at a target pressure using pressure gauge 21. After that, the first power and the first frequency are applied from first high-frequency power supply 25 to the etching gas to excite a plasma. At the same time, the second power and the second frequency are applied from second high-frequency power supply 27 to perform anisotropic plasma etching for substrate 26 for a predetermined time. Reaction chamber 20 is evacuated through an exhaust port using a vacuum pump.

[Application Example]

A case in which an MTJ element according to the above-described embodiment is applied to a magnetic random access memory will be described.

A 1T1R memory cell array in which one memory cell includes one magnetoresistive element and one selection transistor will be exemplified below.

FIG. 31 shows an example of the equivalent circuit of the 1T1R memory cell array.

Memory cell array 28 includes memory cells MC arranged in an array. One memory cell MC includes one magnetoresistive element R and one selection transistor (FET) SW.

Magnetoresistive element R and selection transistor SW are connected in series. One end of the series circuit is connected to first bit line BL1, and the other end is connected to second bit line BL2. The control terminal (gate terminal) of selection transistor SW is connected to word line WL.

Each first bit line BL1 runs in a first direction and has one end connected to bit line driver/sinker 29. Each second bit line BL2 runs in the first direction and has one end connected to bit line driver/sinker & read circuit 30.

However, the structure may be changed such that each first bit line BL1 is connected to bit line driver/sinker & read circuit 30, and each second bit line BL2 is connected to bit line driver/sinker 29.

The positions of bit line driver/sinker 29 and bit line driver/sinker & read circuit 30 may be replaced, or both may be arranged at the same position.

Each word line WL runs in a second direction and has one end connected to word line driver 31.

Figure 32:
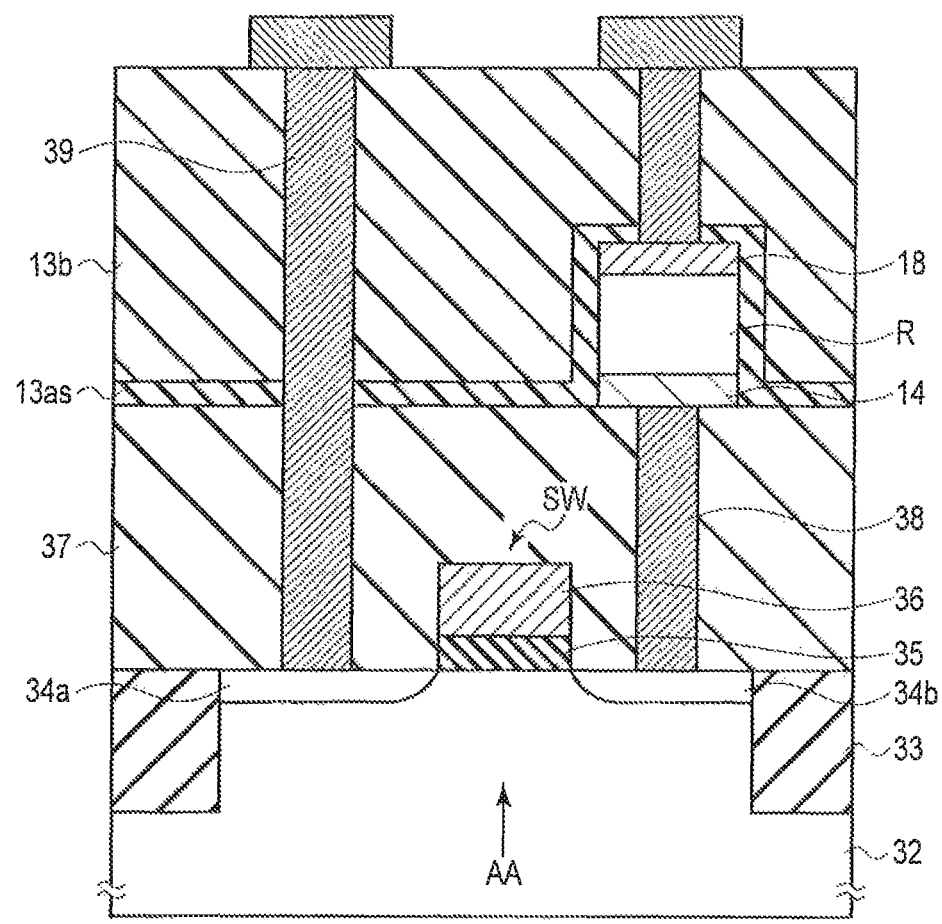
FIG. 32 is a sectional view showing an example of a memory cell.

FIG. 32 illustrates an example of a memory cell.

Selection transistor SW is arranged in active area AA of semiconductor substrate 32. Active area AA is surrounded by element isolation insulating layer 33 in semiconductor substrate 32. In this embodiment, element isolation insulating layer 33 has an STI (Shallow Trench Isolation) structure.

Selection transistor SW includes source/drain diffusion layers 34a and 34b in semiconductor substrate 32, gate insulating layer 35 on a channel between them, and gate electrode 36 on gate insulating layer 35. Gate electrode 36 functions as word line WL.

Interlayer dielectric film 37 covers selection transistor SW. The upper surface of interlayer dielectric film 37 is flat. Lower electrode 14 is arranged on Interlayer dielectric film 37. Lower electrode 14 is connected to source/drain diffusion layer 34b of selection transistor SW via contact plug 38.

Magnetoresistive element R is arranged on lower electrode 14. Upper electrode 18 is arranged on magnetoresistive element R. Upper electrode 18 functions as, for example, a hard mask when processing magnetoresistive element R.

Sidewall protective film 13 as covers the sidewall of magnetoresistive element R.

Interlayer dielectric film 13b is arranged on sidewall protective film 13 as and covers magnetoresistive element R. The upper surface of interlayer dielectric film 13b is flat. First bit line BL1 and second bit line BL2 are arranged on interlayer dielectric film 13b. First bit line BL1 is connected to upper electrode 18. Second bit line BL2 is connected to source/drain diffusion layer 34a of selection transistor SW via contact plug 39. Interlayer dielectric film 13b is silicon oxide layer 13b of the second or fifth embodiment.

When pattering magnetoresistive element R by etching, to improve the process accuracy, for example, IBE (Ion Beam Etching), RIE (Reactive Ion beam Etching), or GCIB (Gas Cluster Ion Beam etching) is used.

When patterning magnetoresistive element R by these methods, a residue as a resputtered layer is known to be formed on the sidewall of magnetoresistive element R. For this reason, making the residue insulated or optimizing the taper angle of magnetoresistive element R (the angle made by the film surface and side surface of each layer in the stacked structure) or a processing condition not to cause the residue is effective. For the residue, a method of making the storage layer and the reference layer have different sizes, and independently patterning the layers is also effective.

Note that the process of this embodiment is also applicable to contact to the electrode of a storage capacitor of a DRAM or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
   forming a silicon nitride layer on a metal layer;
   forming a plasma of a gas mixture of carbon oxide and oxygen; and
   selectively etching the silicon nitride layer with respect to the metal layer by using the plasma of the gas mixture,
   wherein the carbon oxide is one of $CO_2$ and CO,
   a flow rate of $CO_2$ is equal to or larger than 50 sccm and is equal to or smaller than 500 sccm, and
   a flow rate of the oxygen is equal to or larger than 1% of the flow rate of $CO_2$ and is equal to or smaller than 10% of the flow rate of $CO_2$.

2. The method of claim 1,
   wherein the silicon nitride layer is etched by physical etching, and
   a surface of the metal layer is exposed by etching the silicon nitride layer and covered with at least one of carbon and an oxide of the metal layer.

3. The method of claim 1,
   wherein the silicon nitride layer is etched by nonreactive anisotropic physical etching.

4. The method of claim 1, further comprising:
   forming a silicon oxide layer on the silicon nitride layer; and
   selectively etching the silicon oxide layer by using the silicon nitride layer as an etching stopper before etching the silicon nitride layer,
   wherein the silicon nitride layer is etched by using the silicon oxide layer as a mask.

5. The method of claim 4, wherein the silicon oxide layer is selectively etched with respect to the silicon nitride layer by RIE using an etching gas including fluorine.

6. The method of claim 5,
   wherein the etching gas includes at least one of a fluorocarbon and a hydrofluorocarbon.

7. The method of claim 4,
   wherein a pressure and power when etching the silicon nitride layer are lower than a pressure and power when etching the silicon oxide layer, respectively.

8. The method of claim 1, further comprising:
forming the metal layer on a magnetoresistive element as a first metal layer; and
patterning at least part of the magnetoresistive element in a thickness direction by using the first metal layer as a mask,
wherein the silicon nitride layer is formed on a sidewall of the at least part of the magnetoresistive element in the thickness direction and on the first metal layer.

9. The method of claim 8, further comprising:
forming a mask layer on the silicon nitride layer,
wherein a hole reaching the first metal layer is formed in the silicon nitride layer by etching the silicon nitride layer by using the mask layer as a mask.

10. The method of claim 9,
wherein the mask layer comprises a silicon oxide layer.

11. The method of claim 8, further comprising:
forming a second metal layer serving as an underlying layer of the magnetoresistive element,
wherein the magnetoresistive element is patterned by using the first metal layer as the mask until a surface of the second metal layer is exposed, and
the silicon nitride layer is formed on the second metal layer before etching the silicon nitride layer.

12. The method of claim 11,
wherein the silicon nitride layer is left on a sidewall of the magnetoresistive element as a sidewall protective film in a self-aligned manner by etching the silicon nitride layer.

13. The method of claim 11, further comprising:
forming the silicon oxide layer on the silicon nitride layer; and
selectively etching the silicon oxide layer by using the silicon nitride layer as an etching stopper before etching the silicon nitride layer,
wherein the silicon oxide layer and the silicon nitride layer are left on a sidewall of the magnetoresistive element as a sidewall protective film in a self-aligned manner by etching the silicon oxide layer and the silicon nitride layer.

14. The method of claim 8,
wherein the magnetoresistive element comprises a first magnetic layer and a second magnetic layer formed on an insulating layer on the first magnetic layer,
the second magnetic layer is patterned by using the first metal layer as a mask,
the silicon nitride layer is formed on a sidewall of the second magnetic layer of the magnetoresistive element and on the first metal layer, and
the silicon nitride layer is left on a sidewall of the second magnetic layer of the magnetoresistive element in a self-aligned manner by etching the silicon nitride layer.

15. The method of claim 14,
wherein the first magnetic layer is patterned by using the first metal layer and the silicon nitride layer left in the self-aligned manner as a mask.

16. The method of claim 14,
wherein one of the first and second magnetic layers comprises a storage layer having a perpendicular and variable magnetization, and the other of the first and second magnetic layers comprises a reference layer having a perpendicular and invariable magnetization.

17. The method of claim 8, further comprising:
forming a selection transistor with a gate, a source and a drain on a semiconductor substrate;
forming the magnetoresistive element connected to one of the source and the drain above the selection transistor; and
forming a first bit line connected to the first metal layer and a second bit line connected to the other of the source and the drain above the magnetoresistive element.

18. A method of manufacturing a semiconductor device, the method comprising:
forming a metal layer on a magnetoresistive element as a first metal layer
patterning at least part of the magnetoresistive element in a thickness direction by using the first metal layer as a mask;
forming a silicon nitride layer on the first metal layer;
forming a plasma of a gas mixture of carbon oxide and oxygen; and
selectively etching the silicon nitride layer with respect to the first metal layer by using the plasma of the gas mixture;
wherein the silicon nitride layer is formed on a sidewall of the at least part of the magnetoresistive element in the thickness direction and on the first metal layer,
wherein the magnetoresistive element comprises a first magnetic layer and a second magnetic layer formed on an insulating layer on the first magnetic layer,
the second magnetic layer is patterned by using the first metal layer as a mask,
the silicon nitride layer is formed on a sidewall of the second magnetic layer of the magnetoresistive element and on the first metal layer, and
the silicon nitride layer is left on a sidewall of the second magnetic layer of the magnetoresistive element in a self-aligned manner by etching the silicon nitride layer, and
wherein the first magnetic layer is patterned by using the first metal layer and the silicon nitride layer left in the self-aligned manner as a mask.

19. A method of manufacturing a semiconductor device, the method comprising:
forming a silicon nitride layer on a metal layer;
forming a plasma of a gas mixture of only carbon oxide and oxygen; and
selectively etching the silicon nitride layer with respect to the metal layer by using the plasma of the gas mixture.

* * * * *